US008054633B2

United States Patent
Suwa et al.

(10) Patent No.: US 8,054,633 B2
(45) Date of Patent: Nov. 8, 2011

(54) POWER CONVERTER

(75) Inventors: Tokihito Suwa, Hitachinaka (JP); Keiji Kunii, Hitachiota (JP); Hisaya Shimizu, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 749 days.

(21) Appl. No.: 12/143,317

(22) Filed: Jun. 20, 2008

(65) Prior Publication Data
US 2009/0002956 A1  Jan. 1, 2009

(30) Foreign Application Priority Data

Jun. 22, 2007  (JP) ................................ 2007-164763

(51) Int. Cl.
*H05K 7/00* (2006.01)
*H02B 1/20* (2006.01)
(52) U.S. Cl. ...................................... 361/728; 361/637
(58) Field of Classification Search .................. 361/624, 361/637, 641, 807, 728; 439/947, 210
See application file for complete search history.

(56) References Cited

U.S. PATENT DOCUMENTS

| 3,621,461 | A | * | 11/1971 | Cason et al. ..................... 372/90 |
| 3,740,703 | A | * | 6/1973 | Sessions ........................ 439/822 |
| 3,792,315 | A | * | 2/1974 | Salvati et al. ................... 361/605 |
| 4,875,871 | A | * | 10/1989 | Booty et al. .................... 439/209 |
| 5,075,821 | A | * | 12/1991 | McDonnal ...................... 361/721 |
| 5,170,323 | A | * | 12/1992 | Perretta et al. .................. 361/704 |
| 5,196,987 | A | * | 3/1993 | Webber et al. .................. 361/624 |
| 5,269,640 | A | * | 12/1993 | Jonishi et al. ................... 411/55 |
| 5,274,528 | A | * | 12/1993 | Noschese et al. ............... 361/642 |
| 5,351,165 | A | * | 9/1994 | Hancock ......................... 361/637 |
| 5,352,051 | A | * | 10/1994 | Tamura et al. ................... 401/48 |
| 5,375,954 | A | * | 12/1994 | Eguchi ............................ 411/48 |
| 5,430,619 | A | * | 7/1995 | Lindenbaum .................. 361/823 |
| 5,632,351 | A | * | 5/1997 | Ishiyama ...................... 180/65.1 |
| 5,722,989 | A | * | 3/1998 | Fitch et al. ..................... 606/205 |
| 5,764,487 | A | * | 6/1998 | Natsume ........................ 361/775 |
| 5,956,231 | A | * | 9/1999 | Yamada et al. ................. 361/728 |
| 5,959,846 | A | * | 9/1999 | Noguchi et al. ............... 361/782 |

(Continued)

FOREIGN PATENT DOCUMENTS

DE         43 03 793 A1     8/1994

(Continued)

OTHER PUBLICATIONS

Japanese Office Action dated Sep. 8, 2009 (Three (3) pages).

(Continued)

*Primary Examiner* — Lisa Lea Edmonds
*Assistant Examiner* — Xanthia C Cunningham
(74) *Attorney, Agent, or Firm* — Crowell & Moring LLP

(57) ABSTRACT

A power converter which can attain a reliable electric connection with electrodes of a power module by facilitating positioning of conductors connected to the electrodes of the power module. The power converter includes the power module having the plurality of electrodes in the form of plate-shaped conductors within a casing having a lid, and also includes a plurality of plate-shaped conductors connected to the electrodes of the power module. Male screws are embedded in ones of the electrodes of the power module provided at least on the side of the lid to be projected therefrom, the plate-shaped conductors connected to the electrodes having the male screws are formed therein with holes at locations corresponding to the male screws, the male screws being inserted in the corresponding holes, and electrically connected with the electrodes with nuts fastened to the male screws.

16 Claims, 9 Drawing Sheets

U.S. PATENT DOCUMENTS

| | | | |
|---|---|---|---|
| 6,079,920 A * | 6/2000 | Dispenza | 411/107 |
| 6,302,709 B1 | 10/2001 | Ross | |
| 6,434,008 B1 * | 8/2002 | Yamada et al. | 361/728 |
| 6,665,195 B1 * | 12/2003 | Drabon et al. | 361/807 |
| 7,241,152 B2 | 7/2007 | Charrier et al. | |
| 7,301,755 B2 * | 11/2007 | Rodriguez et al. | 361/676 |
| 7,358,442 B2 * | 4/2008 | Radosevich et al. | 174/68.2 |
| 7,619,899 B2 * | 11/2009 | Rubenstein et al. | 361/740 |
| 2003/0031038 A1 * | 2/2003 | Shirakawa et al. | 363/144 |
| 2003/0142485 A1 * | 7/2003 | Szu | 361/816 |
| 2003/0200761 A1 | 10/2003 | Funahashi et al. | |
| 2004/0100777 A1 * | 5/2004 | Lee | 361/758 |
| 2005/0214099 A1 * | 9/2005 | Silvestro et al. | 411/424 |
| 2005/0220560 A1 * | 10/2005 | Shinozaki et al. | 411/37 |
| 2006/0086981 A1 * | 4/2006 | Yamaguchi et al. | 257/347 |
| 2006/0231285 A1 | 10/2006 | Bisson et al. | |
| 2007/0225718 A1 * | 9/2007 | Ensign | 606/69 |
| 2008/0112201 A1 * | 5/2008 | Yahata et al. | 363/131 |
| 2008/0316698 A1 * | 12/2008 | Yeh et al. | 361/685 |

FOREIGN PATENT DOCUMENTS

| | | |
|---|---|---|
| EP | 0 392 836 A2 | 10/1990 |
| EP | 1 376 696 A1 | 1/2004 |
| FR | 2 779 279 A1 | 12/1999 |
| FR | 2 852 450 A1 | 9/2004 |
| FR | 2 852 451 A1 | 9/2004 |
| JP | 10-322973 A | 12/1998 |
| JP | 2000-216331 A | 8/2000 |
| JP | 2001-210392 A | 8/2001 |
| JP | 2001-268942 A | 9/2001 |
| JP | 2003-322082 A | 11/2003 |
| JP | 2006-121834 A | 5/2006 |

OTHER PUBLICATIONS

European Search Report dated Oct. 6, 2010 (Eleven (11) pages).
"Goujons a souder filetes PT pour amorcage par pointe", [Online], Jun. 30, 2006, XP002600221, pp. 8-21, with partial mechanical translation.

* cited by examiner

New Sheet

POWER CONVERTER

BACKGROUND OF THE INVENTION

The present invention relates to a power converter and more particularly, to a technique for increasing the productivity of the power converter.

A power converter, for example, an inverter includes, as its main constituent elements, a power module having a plurality of switching semiconductor elements, a control circuit board for controlling the operations of the plurality of switching semiconductor elements in the power module, and a smoothing capacitor connected to a DC side of the power module. Respective constituent elements including the aforementioned elements are accommodated within a single casing.

The inverter thus arranged is located between a DC power source and an electrical load so that a DC power source side of the inverter is connected to both ends of the smoothing capacitor and an electrical load side of the inverter is connected to an AC side of the power module. In the inverter, a signal indicative of a torque command or a rotation command is input to the control circuit board so that the ON/OFF operations of the plurality of switching semiconductor elements are controlled with use of a drive signal received from a drive circuit board via the control circuit board, whereby a power to be supplied to the electrical load from the DC power source is converted.

In the inverter, current paths from the DC power source to the smoothing capacitor and to the power module as well as current paths from the power module to the electrical load side are made, in many cases, in the form of bus bars made of plate-shaped conductors. For this reason, the power module has a plurality of electrodes or terminals for interconnection with the plate-shaped conductors (bus bars). The plurality of electrodes or terminals are made in the form of plate-shaped conductors and are exposed outside of the case of the power module.

One of background arts of the power converter thus arranged is known as disclosed, for example, in JP-A-2000-216331. Disclosed in JP-A-2000-216331 is such a technique that lamination conductors are stacked on the outer terminals of the power module and the outer terminals and the lamination conductors are connected by bolts.

When such a power converter as the aforementioned inverter is assembled, the power module is located with the casing and then the plurality of electrodes or terminals provided to the power module and the plate-shaped conductors (bus bars) are interconnected by tightening members such as bolts as in the background art. Upon the interconnecting works between the electrodes or terminals and the conductors, threaded holes provided in the both are positioned and then the both members are interconnected by the tightening members.

In such a power converter requiring a high miniaturization or compactness as an inverter used in a vehicle, the power module and the smoothing capacitor are located, in many cases, close to the wall of the casing. In such a case, it is hard to secure a sufficient working zone in the vicinity of the plurality of electrodes or terminals provided to the power module, it becomes highly difficult to confirm the positioning to the plate-shaped conductors (bus bars) and thus the interconnecting works between the plurality of electrodes or terminals provided to the power module and the plate-shaped conductors (bus bars). For this reason, it has so far been demanded to such a technique as to increase a working efficiency upon assembling the power converter including the interconnecting works between the plurality of electrodes or terminals provided to the power module and the plate-shaped conductors (bus bars) and eventually to increase the productivity of the power converter.

SUMMARY OF THE INVENTION

In accordance with typical one of aspects of the present invention, there is provided a power converter which can suitably increase a productivity.

The typical aspect of the present invention is featured in that projections for fitting into the holes of conductors to be connected to electrodes or terminals exposed outside of power module having switching semiconductor elements are provided to the electrodes or terminals.

When the projections such as bolts are embedded into the electrodes or terminals exposed outside of the power module, the projections can be integrally formed with the electrodes or terminals exposed outside of the power module.

In accordance with the typical aspect of the present invention, when the power converter is assembled, positioning between the electrodes or terminals exposed outside of the power module and the conductors to be connected to the electrodes or terminals can be simplified, and an efficiency of interconnecting works between the electrodes or terminals exposed outside of the power module and the conductors to be connected to the electrodes or terminals can be increased, by fitting the electrodes or terminals exposed outside of the power module into the holes to be connected to the electrodes or terminals.

The present invention has been explained in connection with the typical aspect of solving problems in the prior art, the present invention has other aspects of solving the problems. The present invention will be explained in connection with other preferred aspects of the present invention.

In the typical aspect of the present invention, since an assembling efficiency is increased over the prior art, there can be provided a power converter which is suitably increased in productivity.

The increased productivity of the power converter enables the production cost of the power converter to be lowered and a system having the power converter mounted therein to be inexpensively manufactured. For example, when the power converter is mounted to an environmental friendly vehicle such as a hybrid car, the price of the hybrid car can be lowered, thus contributing to spread of the environmental friendly vehicle.

Other objects, features and advantages of the invention will become apparent from the following description of the embodiments of the invention taken in conjunction with the accompanying drawings.

DESCRIPTION OF THE EMBODIMENTS

Figure 1:
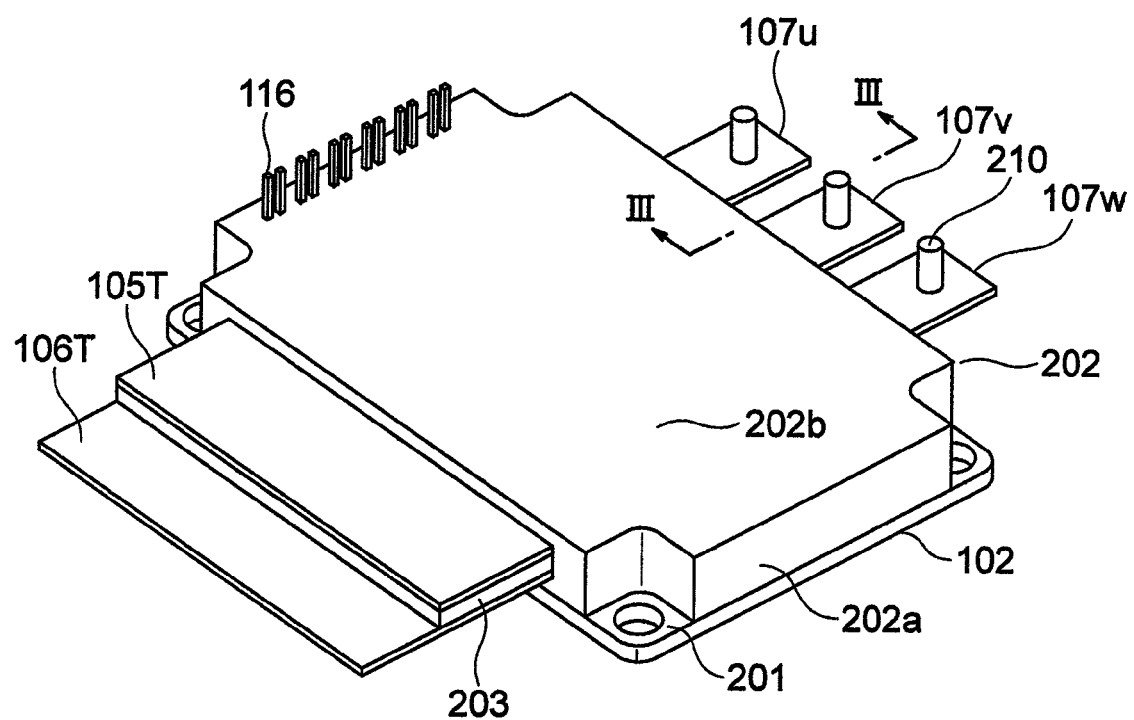
FIG. 1 is a perspective view of a power module built in a power converter in accordance with an embodiment of the present invention.

The present invention will be explained in connection with an embodiment of the invention with reference to the attached drawings.

In the present embodiment, explanation will be made in connection with an example when a power converter in accordance with the embodiment of the present invention is mounted to a vehicle such as a car using a mechanical energy obtained through electric energy conversion as a car driving source, in particular, to a hybrid car as typical one of environmental friendly cars.

In the present embodiment, explanation will also be made in connection with an example when the arrangement of the power converter of the present invention is applied as an inverter for converting a DC power supplied from a car-mounted power source into a 3-phase AC power to supply the converted AC power to an electrical load. The arrangement of the present invention is also applied to another power converter, for example, to a chopper for controlling a DC power to be supplied from a car-mounted power source to an electrical load, or to a DC-DC converter for increasing or decreasing the voltage of the DC power between the car-mounted power source and the electrical load.

In the present embodiment, further, explanation will be made in connection with an example when the arrangement of the present invention is applied to an inverter which controls the driving operation of a motor for generating a vehicle driving force. The arrangement of the present invention may also be applied to an inverter for controlling the driving operation of such a car-mounted auxiliary device as a power steering motor for generating a steering force or a braking electric motor for generating a braking force, and to an inverter for controlling the driving operation of a motor for generating a driving force for a car-mounted air conditioner compressor.

The arrangement of the present invention can be applied also to a power converter for use other than a vehicle, an industrial power converter to be installed in a power facility such as a factory, and a domestic power converter to be mounted in a home appliance such as an air conditioner. Since the assembling efficiency is increased, the present invention is suitably applied to such a power converter as to require reduction of a production cost.

The power converter of the present embodiment to which the present invention is applied can advantageously attain miniaturization, weight reduction, height dimension reduction, increased power conversion efficiency (reduced loss), suppressed heat generation, increased productivity, reduced cost, and increased reliability.

From improvement in fuel economy and consideration of global environment, the number of cars having an internal combustion engine with a force of driving a car or a car-mounted auxiliary device so far partially or wholly supplemented with a driving force obtained through electric energy conversion, is increased in these years. Such a car is equipped with such a single power converter such as an inverter as a DC-DC power converter, a chopper as a DC-DC power converter, or a DC-DC converter; and in some cases, a plurality of such power converters are mounted in a single car.

The price of the car having the power converter mounted therein is higher by a cost corresponding to the mounted power converter than such a car as to have the engine supplemented with the driving force of the vehicle and car-mounted auxiliary device. For this reason, the power converter is highly required to reduce its cost. The power converter is mounted, in many cases, in such a narrow space as in an engine room or a space under a floor, because a passenger space and a luggage storage space are secured. This requires the power converter to be made compact. Such a power converter as integrally formed on the ceiling side of a car-mounted rotary electric machine carried in the car is further required to further reduce its height. For the purpose of further improving the fuel economy of the car by reducing the weight of the car, the power converter is highly required to reduce its weight.

The power converter includes a power module in which a plurality of switching semiconductor elements having an insulated gate bipolar transistor (which will be referred to as "IGBT", hereinafter) and a metal oxide semiconductor field effect transistor (which will be referred to as "MOSFET", hereinafter) are accommodated, and forms a power conversion main circuit. Since the switching semiconductor elements produce heat due to their switching operation, it is required to cool the power module. However, the cooling method is limited depending on the mounting location of the power converter and thus the power module cannot be efficiently cooled. For this reason, the power converter is highly required to reduce the heat generation of the switching semiconductor elements. Since the reduced heat generation of the switching semiconductor elements enables the switching semiconductor elements to employ a compact chip, the power converter can be made compact.

One of means for reducing the heat generation of the switching semiconductor elements can be considered to reduce the switching loss of the switching semiconductor elements and to shorten the switching time of the switching semiconductor elements, and in other words, to increase a power conversion efficiency based on the switching semiconductor elements.

For the purpose of reducing the switching loss of the switching semiconductor elements, it is vital to reduce an inductance parasitic on the main circuit. The reduction of the inductance parasitic on the main circuit is important because the inductance reduction can suppress a surge voltage caused by a DC voltage based on switching operation noise of the switching semiconductor elements and can prevent destruction of the switching semiconductor elements.

The inductance parasitic on the main circuit can be reduced by providing a lamination structure wherein a lamination structure is provided so that plus and minus sides of DC side electrodes or DC terminals exposed outside of the power module are electrically insulated from each other, and plus and minus sides of plate-shaped conductors (bus bars) connected to the DC side electrodes or the DC terminals are electrically insulated from each other, whereby the directions of currents flowing through the plus side conductor and the minus side conductor are opposed to each other.

The parasitic inductance can be reduced by increasing the width (referred to as the "current width", hereinafter) of the conductor in a direction perpendicular to the current flowing direction and by decreasing the length (referred to as the "current length", hereinafter) of the conductor in the current flowing direction. The parasitic inductance can be more effectively reduced by combining these arrangements.

In the power converter using a MOSFET as the switching element, the reduction of the parasitic inductance enables the switching time to be shortened with a reduced switching loss. In other words, the inductance reduction can effectively increase a power conversion efficiency. In the power converter using an IGBT, the capacity of a snubber circuit as one of circuits for protecting the surge voltage of the switching semiconductor element can be made small and a snubber loss can be effectively reduced.

In view of the above problems, the power converter of the present embodiment has been made. The power converter has features and operational effects which follow.

In the power converter of the present embodiment, projection bodies are formed separately from each of the DC side electrodes or DC side terminals exposed outside of the power module having switching semiconductor elements and AC side electrodes or AC side terminals and the projection bodies such as bolts having a screw mechanism are embedded with press-fit technology, and projections for fitting into holes of plate-shaped conductors (bus bars) to be connected to the DC side electrodes or terminals or to the AC side electrodes or terminals are integrally formed with the DC side electrodes or terminals and with the AC side electrodes or terminals.

In accordance with the power converter of the present embodiment, upon assembling the power converter, since the projections of the DC side electrodes or terminals and of the AC side electrodes or terminals are fitted into the holes of the plate-shaped conductors (bus bars), positioning between the DC side electrodes or terminals and the AC side electrodes or terminals and the plate-shaped conductors (bus bars) can be easily achieved, thus increasing an efficiency of interconnecting the DC side electrodes or terminals and the AC side electrodes or terminals and the plate-shaped conductors (bus bars). As a result, the power converter of the present embodiment has an assembling efficiency and a productivity higher than the prior art.

In the power converter of the present embodiment, since the productivity of the power converter can be increased, the production cost of the power converter can be lowered. Thus, the power converter of the present embodiment can contribute to reduction of the price of a car having the power converter mounted therein, and also can contribute to spread of such cars as to complement some or whole of a driving force of a car and a car-mounted auxiliary device with a driving force obtained through electric energy conversion.

In the power converter of the present embodiment, since the DC side electrodes or terminals are connected to the DC side plate-shaped conductors (DC side bus bars) with use of the projections embedded in the DC side electrodes or terminals, a clearance hole so far provided in the DC side plate-shaped conductors (DC side bus bars) for interconnection between the DC side electrodes or terminals and DC side plate-shaped conductors (DC side bus bars) can be eliminated or reduced. As a result, in the power converter of the present embodiment, a parasitic inductance can be reduced by an amount corresponding to the elimination or reduction of a current width narrowing location.

One of methods of increasing the current width narrowed by the clearance hole is considered to increase the conductor width between the DC side electrodes or terminals and the DC side plate-shaped conductors (DC side bus bars). Such consideration leads to increase of the capacity of the power converter and increase of the weight thereof.

In the power converter of the present embodiment, since the parasitic inductance can be reduced, the switching time of the switching semiconductor element can be correspondingly shortened. Thus, in the present embodiment of the present embodiment, the switching loss of the switching semiconductor element can be reduced and a power conversion efficiency based on the switching semiconductor elements can be increased. Since the reduction of the parasitic inductance suppresses the surge voltage of a DC current caused by the switching operation noise of the switching semiconductor elements and prevents destruction of the switching semiconductor elements, the power converter can be increased in reliability.

In the power converter of the present embodiment, since the switching loss of the switching semiconductor element can be reduced, the heat generation of the switching semiconductor element can be suppressed. As a result, the power converter of the present embodiment can employ an air cooling structure as its cooling means with the simplified cooling structure and an increased freedom of vehicle mounting position.

With the power converter of the present embodiment, since the reduction of the parasitic inductance eliminates the need for increasing the conductor width between the DC side electrodes or terminals and the DC side plate-shaped conductors (DC side bus bars), the power converter can be made compact and light in weight. With the power converter of the present embodiment, since the heat generation of the switching semiconductor element can be reduced, a compact chip can be employed as the switching semiconductor elements and the power converter can be made compact. With the power converter of the present embodiment, a mechanism of positioning between the DC side electrodes or terminals, the AC side electrodes or terminals, and the plate-shaped conductors (bus bars) is formed by utilizing part of a means for tightly coupling the DC side electrodes or terminals, the AC side electrodes or terminals, and the plate-shaped conductors (bus bars). Thus, the need for adding a new component such as a boss or abutting member to the power module as the mechanism of positioning between the DC side electrodes or terminals, the AC side electrodes or terminals, and the plate-shaped conductors (bus bars) or for newly processing the DC side electrodes or terminals themselves, the AC side electrodes or terminals themselves, and the plate-shaped conductors (bus bars) themselves can be eliminated, thus contributing to compactness of the power converter with reduced weight and cost.

In the power converter of the present embodiment, the DC side electrodes or terminals and the AC side electrodes or terminals are externally exposed so as to be projected from the side wall of the case of the power module toward the side thereof.

With the power converter of the present embodiment having such an arrangement, a circuit board having circuit elements mounted thereon for driving the switching semiconductor elements and controlling the switching operation of the switching semiconductor elements can be located on the opposite side of the base of the power module in a direction (height direction) of installing the power module to the casing of the power converter. As a result, with the power converter of the present embodiment, the dimension of the power module in the power module installing direction (height direction) can be decreased.

In this way, when the height dimension of the power module is decreased, a freedom of position of the power converter in the car can be increased and the power converter can be easily mounted in the engine room and in a narrow space under the floor. In particular, the power converter is suitably integrally formed on the ceiling side of the rotary electric machine installed in the car.

Embodiment 1

Figure 2:
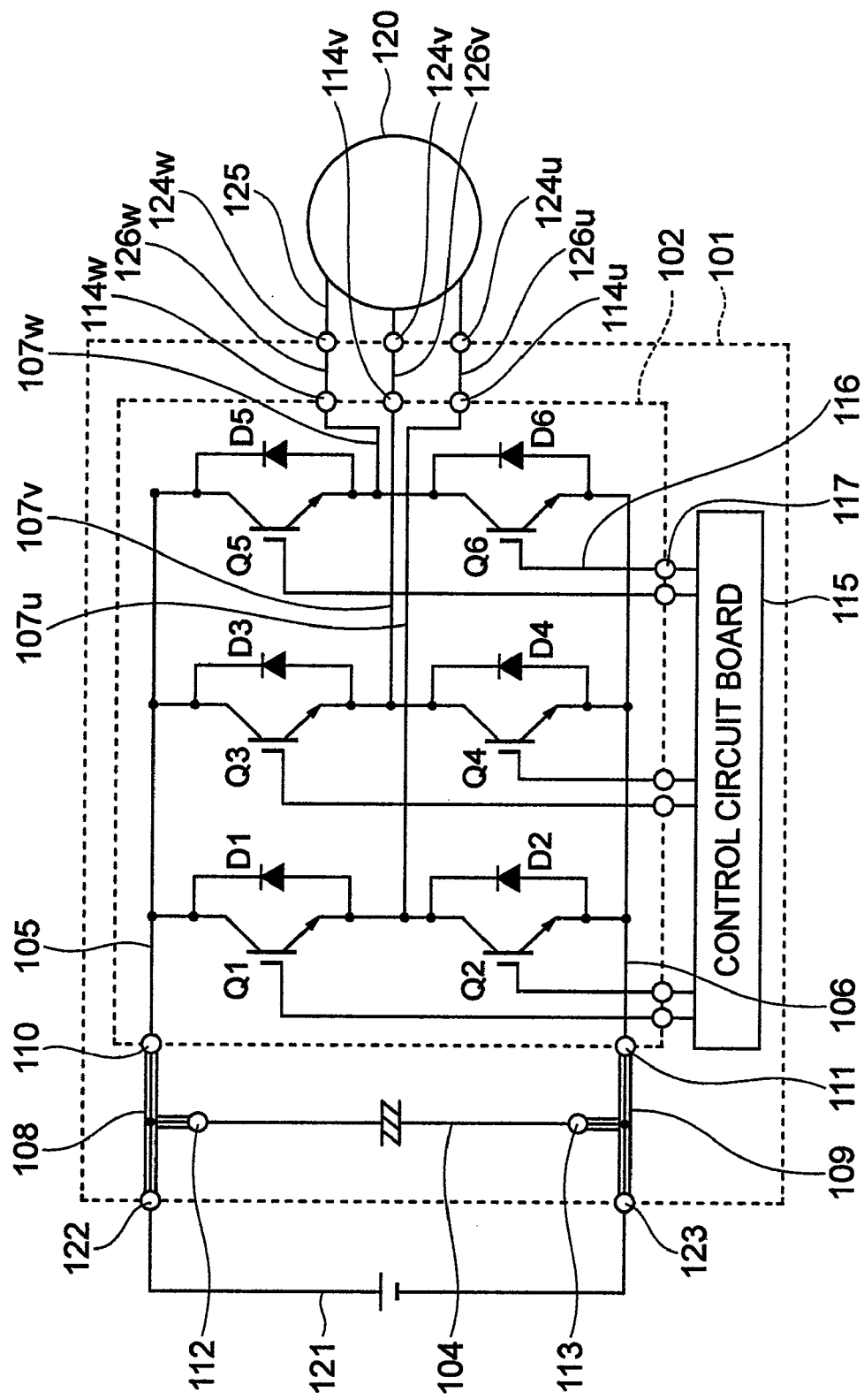
FIG. 2 is a circuit diagram of the embodiment of the power converter of the invention, showing a DC power source and a rotary electric machine.

FIG. 2 shows a circuit diagram of a power converter in accordance with an embodiment of the present invention, showing a DC power source 121, a rotary electric machine 120, and a power converter 101, connected to the circuit diagram.

In FIG. 2, the interior of the power converter 101 is shown by a dotted line frame, and the frame corresponds to a casing (denoted by reference numeral 901 in FIG. 11) of the power converter 101.

Provided in the interior of the power converter 101 are a smoothing capacitor 104, a power module 102, and a control circuit board 115. A dotted line frame indicative of the power module 102 corresponds to a case (denoted by reference numeral 201, 202 in FIG. 1) of the power module 102.

The DC power source 121 is located outside of the power converter 101 and a plus terminal of the DC power source 121 is connected to one end of the smoothing capacitor 104 via a connection 122 of the power converter 101 and also connected to a plus side line 105 in the power converter 101 via a connection 110 of the power module 102. In the illustrated example, interconnection between one end of the smoothing capacitor 104 and the connections 122, 110 are made by means of a DC bus bar 108.

A minus terminal of the DC power source 121 is connected to the other end of the smoothing capacitor 104 via a connection 123 of the power converter 101, and also connected to a minus side line 106 in the power module 102 via a connection 111 of the power module 102. In the illustrated example, the interconnection between the other end of the smoothing capacitor 104 and the connections 123, 111 is made by means of a DC bus bar 109.

In the interior of the power module 102, a U-phase arm as a serial connection of, e.g., IGBTs Q1 and Q2, a V-phase arm as a serial connection of, e.g., IGBTs Q3 and Q4, and a W-phase arm as a serial connection of, e.g., IGBTs Q5 and Q6 are connected between the plus side line 105 and the minus side line 106.

Diodes D1 to D6 for causing a current to flow from the emitter side to the collector side are connected between collectors and emitters of the IGBTs Q1 to Q6.

The IGBTs Q1 to Q6 and the diodes D1 to D6 form an inverter. In the inverter, a PWM pulse is applied to each gate electrode of the IGBTs Q1 to Q6 from the control circuit board 115 to control the switching operation of the IGBTs Q1 to Q6.

The IGBTs Q1 to Q6 and the diodes D1 to D6 may be replaced with MOSFETs each having a backward diode built therein respectively.

Intermediate connection points between the phase arms in the inverter of the power module 102 are connected to one ends of the phase windings of the rotary electric machine 120. The rotary electric machine 120 is a 3-phase permanent magnet motor in which the other ends of the 3 U-, V-, and W-phase windings are connected to a common intermediate point.

One end of the U-phase winding is connected to an intermediate connection point between the IGBTs Q1 and Q2 via a connection 124$u$ of the power converter 101 and via a connection 114$u$ of the power module 102. One end of the V-phase winding is connected to an intermediate connection point between the IGBTs Q3 and Q4 via a connection 124$v$ of the power converter 101 and via a connection 114$v$ of the power module 102. One end of the W-phase winding is connected to an intermediate connection point between the IGBTs Q5 and Q6 via a connection 124$w$ of the power converter 101 and via a connection 114$w$ of the power module 102.

The DC power source 121 in FIG. 2 may be used to be connected, for example, not only to a battery but also to a DC-DC converter, a generator or the like.

The power module 102 may be divided into 3 sections corresponding to the respective AC phases or into 6 sections according to high and low potentials.

FIG. 1 is a perspective view of an external appearance of one embodiment of the power module 102.

In FIG. 1, a casing of the power module 102 is made up of a base 201 and a case 202 mounted on the base 201. The case 202 is constructed with a wall portion 202$a$ standing along the edge portion of the base 201 and a lid portion 202$b$ covering an opening portion opposite to the base 201 side of the wall portion 202$a$.

An inverter including the IGBTs Q1 to Q6 and the diodes D1 to D6 is built in the side of the base 201 opposed to the case 202.

A plus-side main electrode 105T connected to the plus side line 105 and a minus-side main electrode 106T connected to the minus side line 106 are formed on one side surface of the case 202 to be projected therefrom.

The plus-side main electrode 105T and the minus-side main electrode 106T are connected to the electrodes of the smoothing capacitor 104 via the DC bus bars 108 and 109 respectively. Thus the plus-side main electrode 105T and the minus-side main electrode 106T correspond to the connections 110 and 111 shown in FIG. 2 respectively.

The plus-side main electrode 105T and the minus-side main electrode 106T are shaped each into a plate having a short length in a current flowing direction and a long length in a direction perpendicular to the current flowing direction, and these main electrode plates are located to be overlapped each other with an insulating plate 203 disposed therebetween. The insulating plate 203 is made of, for example, polybutyrene terephthalate, polyphenylene sulfide or the like, and the plate is molded integrally with, e.g., the case 202 with the same resin as the case.

When the plus-side main electrode 105T and the minus-side main electrode 106T are arranged in such a manner as mentioned above and the current flowing directions through the respective electrodes are opposed to each other, the parasitic inductance can be sufficiently reduced.

For example, the minus-side main electrode 106T is formed slightly longer in current direction than the plus-side main electrode 105T, and is formed to be exposed from the plus-side main electrode 105T when viewed from its top side. With such an arrangement, the DC bus bars 108 and 109 can be connected from the same direction (the upper side direction in the drawing).

An AC-side main electrode 107$u$ connected to the intermediate connection point of the U-phase arm of the inverter, an AC-side main electrode 107$v$ connected to the intermediate connection point of the V-phase arm, and an AC-side main electrode 107$w$ connected to the intermediate connection point of the W-phase arm are located on the side of the case 202 opposed to the projected plus- and minus-side main electrodes 105T and 106T to be projected therefrom.

The AC-side main electrodes 107u, 107v and 107w are provided to have nearly the same height with respect to the power module 102 and to be parallel to each other.

A male screw 210 is embedded in each of the AC-side main electrodes 107u, 107v and 107w to be extruded upwards of the drawing at a nearly central position thereof.

When the AC-side main electrodes 107u, 107v and 107w are arranged in this way, the positioning of AC conductors 126u, 126v and 126w can be easily achieved upon interconnection with the AC conductors 126u, 126v and 126w and the interconnection can be made reliably, which will be explained later.

A plurality of pin-like electrodes 116 are embedded in the upper surface of the case 202. These pin-like electrodes are used to be electrically connected with the control circuit board 115, and correspond to connections 117 shown in FIG. 2.

Figure 3A:
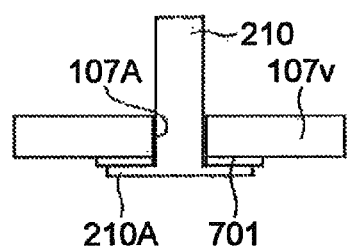
FIGS. 3A to 3E show examples of a structure wherein a male screw is embedded in an AC-side main electrode of the power module.

FIG. 3A shows a cross-sectional view of a structure of mounting the male screw 210 in the AC-side main electrode 107v, taken along a plane including the central axis of the male screw 210. An arrangement to be explained below holds true even for the AC-side main electrodes 107u and 107w.

The male screw 210 having a flange 210A is inserted from its tip end side into a hole 107A formed in the AC-side main electrode 107v, and the male screw 210 is fixed to the AC-side main electrode 107v with a brazing material 701 disposed at a location between the flange 210A and the AC-side main electrode 107v.

Figure 3B:
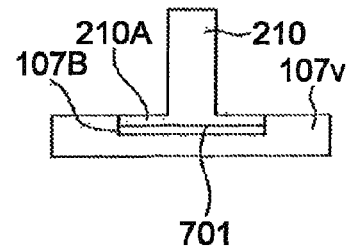

The present invention is not limited to such an arrangement as shown in FIG. 3A. For example, as shown in FIG. 3B, the male screw 210 may be fixed to the AC-side main electrode 107v by locating the flange 210A of the male screw 210 in a recess 107B formed in the surface part of the AC-side main electrode 107v with the brazing material 701 disposed therebetween.

Figure 3C:
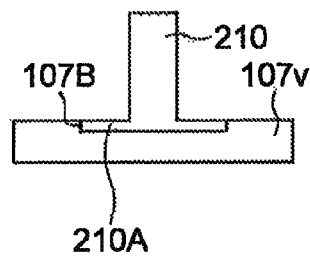

As shown in FIG. 3C, further, the male screw 210 may be fixed to the AC-side main electrode 107v by pressing the male screw 210 into the recess 107B formed on the surface of the AC-side main electrode 107V at the flange 210A.

Figure 3D:
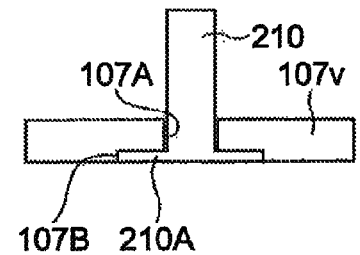

As shown in FIG. 3D, the male screw 210 may be fixed to the AC-side main electrode 107v by inserting the male screw 210 from its tip end side into the hole 107A of the AC-side main electrode 107v and tightly screwing the flange 210A into the recess 107B formed in the AC-side main electrode 107v around the hole 107A.

In the mounting such a male screw 210 in the AC-side main electrodes 107u, 107v and 107w, it is preferable that, for example, the flange 210A of the male screw 210 be less extruded from the side surface of the AC-side main electrode opposed to the projected male screw 210. With such an arrangement, a gap between the electrode and another polarity electrode to be overlapped therewith can be made small and the parasitic inductance can be reduced.

The male screw 210 having a projection part on one conductor surface of the AC-side main electrode 107u, 107v, 107w is fixed to the AC-side main electrode 107u, 107v, 107w, has the flange 210A as its head part smaller in thickness than the AC-side main electrode 107u, 107v, 107w, and also has the projection part erected on one surface of the head part and having a diameter smaller than the shortest distance from the center of the head part to its outer edge. Though the head part is formed to be a disk or a short circular cylinder, another shape of plate or short circular cylinder may be employed therefore. The projection part is a circular cylinder formed to be threaded in its outer peripheral surface.

Figure 4:
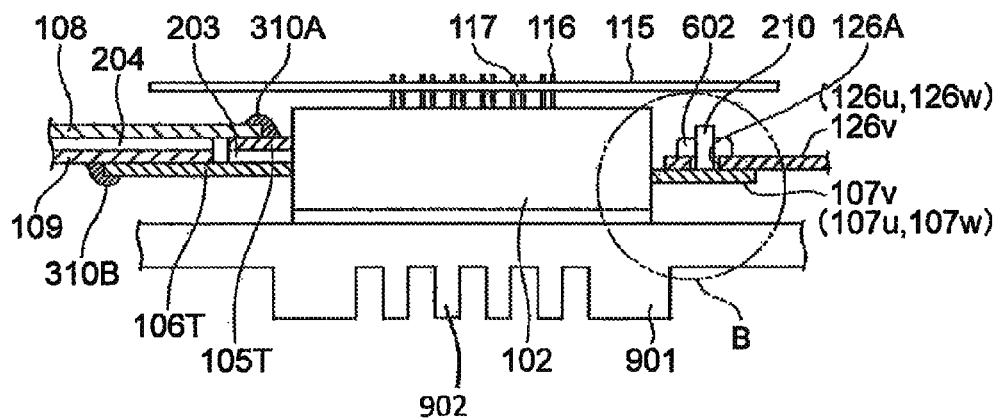
FIG. 4 shows a cross-sectional view of the power module and the vicinity thereof when the power module is built in a casing of the power converter.

FIG. 4 shows a cross-sectional view of a structure in the vicinity of the power module 102 when the power module 102 is mounted in the casing 901 of the power converter. In FIG. 4, the arrangement of the interior of the power module 102 is not illustrated or omitted.

The power module 102 is, for example, screwed to the casing 901 with a grease (not shown) disposed at the bottom of the casing 901. A heat radiating means having, e.g., a heat radiator fin 902 is provided on the bottom of the casing 901.

The DC bus bars 108 and 109 connected at both ends of the smoothing capacitor (denoted by reference numeral 104 in FIG. 2) not shown therein are located to be extended toward the plus-side main electrode 105T and minus-side main electrode 106T of the power module 102.

Similarly to the plus-side main electrode 105T and the minus-side main electrode 106T, the DC bus bars 108 and 109 are made each in the form of a plate having a short side in the current flowing direction and a long side in a direction perpendicular to the flow current direction; and the bus bars are overlapped each other with an insulating plate 204 disposed therebetween.

The DC bus bar 108 is formed so that the tip end of the bus bar is extended longer than that of the DC bus bar 109 and so that the tip end of the DC bus bar 108 is located on the upper surface of the plus-side main electrode 105T and the tip end of the DC bus bar 109 is located on the upper surface of the minus-side main electrode 106T.

The tip end of the DC bus bar 108 is electrically connected to the plus-side main electrode 105T by a brazing material 310A, and the tip end of the DC bus bar 109 is electrically connected to the minus-side main electrode 106T by a brazing material 310B.

The AC conductor 126v (126u, 126w) is located to be extended from the connection 124v (124u, 124w) provided to the casing 901 of the power converter toward the AC-side main electrode 107v (107u, 107w) of the power module 102. The connection 124v (124u, 124w) is connected to the V phase (U phase, W phase) of the rotary electric machine 120 as shown in FIG. 2.

The AC conductor 126v (126u, 126w) is formed in its tip end with a hole 126A, the male screw 210 of the AC-side main electrode 107v (107u, 107w) is inserted into the hole 126A, and then a nut 602 threadedly and tightly receives the male screw 210, whereby the AC conductor 126v (126u, 126w) is electrically connected to the AC-side main electrode 107v (107u, 107w).

With such an arrangement, since the AC conductor 126v (126u, 126w) is located by inserting the male screw 210 of the AC-side main electrode 107v (107u, 107w) in the hole 126A formed therein, positioning to the AC-side main electrode 107v (107u, 107w) can advantageously be reliably achieved. Thereafter, since the nut 602 tightly and threadedly receives the male screw 210, electric connection with the AC-side main electrode 107v (107u, 107w) can advantageously be sufficiently secured.

In the embodiment shown in FIG. 4, the control circuit board 115 is located above the power module 102 so as to cover the power module 102.

The control circuit board 115 has holes through which the pin-like electrodes 116 are passed, the pin-like electrodes 116 are projected from the upper surface of the power module 102, the control circuit board 115 includes the connections 117 connected to the wiring layer on the control circuit board 115 around the holes of the control circuit board 115, and the connections 117 are electrically connected to the corresponding pin-like electrodes 116, for example, by solder.

Figure 5A:
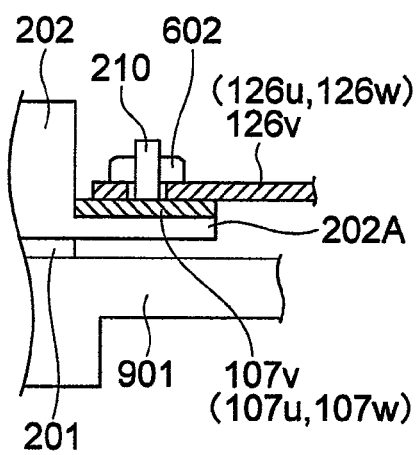
FIGS. 5A and 5B show other examples of the vicinity of the AC-side main electrode of the power module.
Figure 5B:
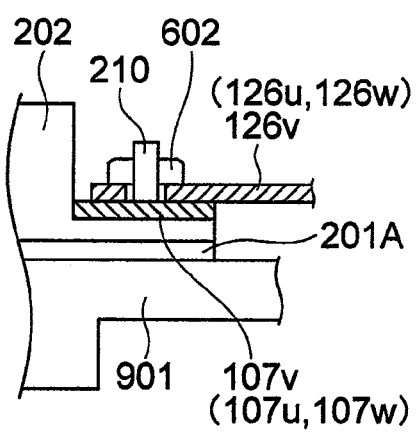

FIGS. 5A and 5B are diagrams for explaining other modifications of the structure of FIG. 4, corresponding to a frame B enclosed by a two-dot chain line.

In FIG. 5A, the case 202 of the power module 102 has a base 202A integrally formed with the case 202, and the AC-side main electrode 107v (107u, 107w) formed to be extruded from the case 202 is mounted on the case 202. With such an arrangement, the AC-side main electrode 107v (107u, 107w) can reliably be sufficiently spaced from the casing 901 by an insulating distance therebetween.

In FIG. 5B, the base 201 of the power module 102 may be formed with an extension 201A extended outwardly. In such a case, the cooling effect can be enhanced due to the increased heat radiating surface area of the casing 901.

Figure 6A:
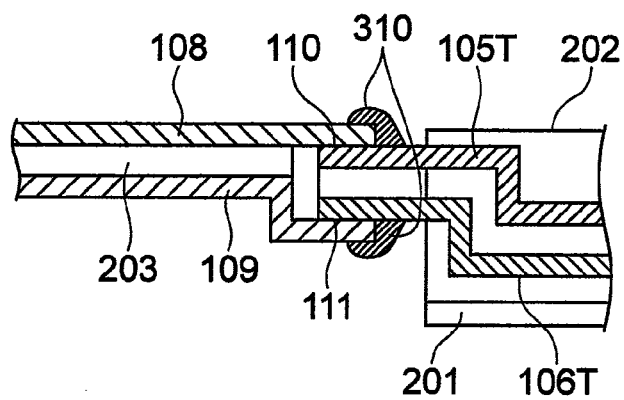
FIGS. 6A and 6B show other examples of the vicinities of plus-side and minus-side main electrodes of the power module.

The power module 102 shown in FIG. 1 is arranged so that the plus-side main electrode 105T is shorter than the minus-side main electrode 106T. However, the present invention is not limited to the above example. For example, as shown in FIG. 6A, the plus-side main electrode 105T may have the same length (in the current direction) as the minus-side main electrode 106T. In this case, as shown in FIG. 6A, the DC bus bars 108 and 109 are brought into contact with the plus-side main electrode 105T and the minus-side main electrode 106T, for example, from upper and lower opposing directions respectively and then connected thereto by means of, e.g., a brazing material 310.

Figure 6B:
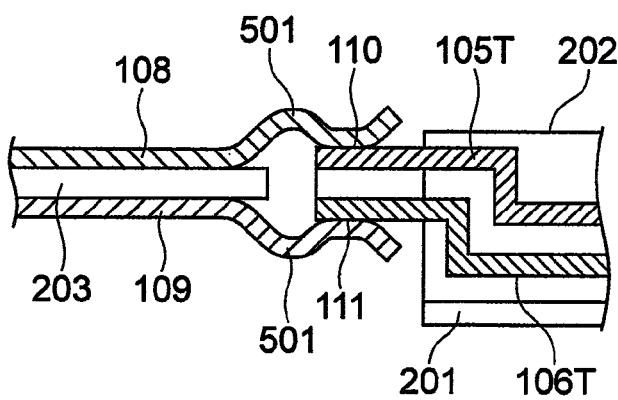

In FIG. 6A, the connection between the plus-side main electrode 105T and the DC bus bar 108 and the connection between the minus-side main electrode 106T and the DC bus bar 109 are made, for example, with use of the brazing material 310. However, the present invention is not limited to this example. For example, as shown in FIG. 6B, a bent part 501 may be formed in each of the DC bus bars 108 and 109 in front of the connections 110 and 111 with the plus-side main electrode 105T and the minus-side main electrode 106T, so that the bent parts 501 cause the DC bus bars 108 and 109 to resiliently hold the plus-side main electrode 105T and the minus-side main electrode 106T therebetween.

Embodiment 2

Figure 7A:
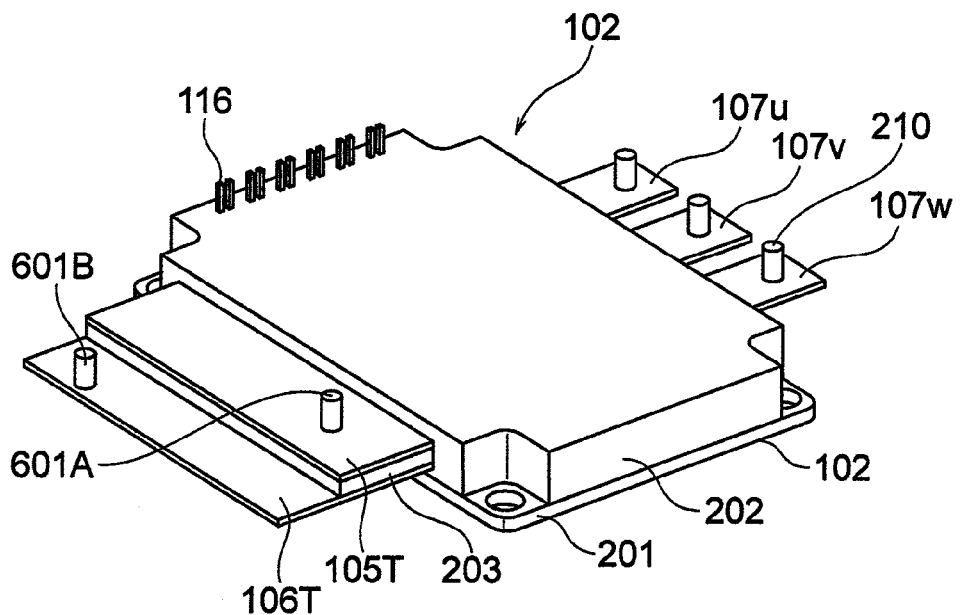
FIGS. 7A and 7B show perspective views of other examples of the power module having a power converter built therein in the embodiment of the present invention.
Figure 7B:
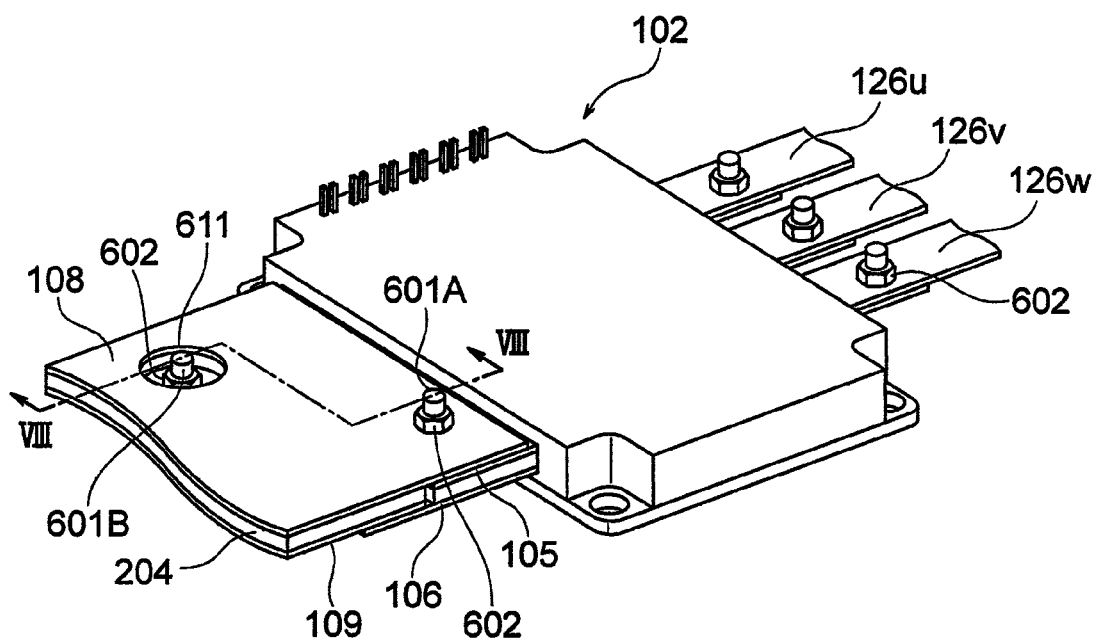
Figure 8:
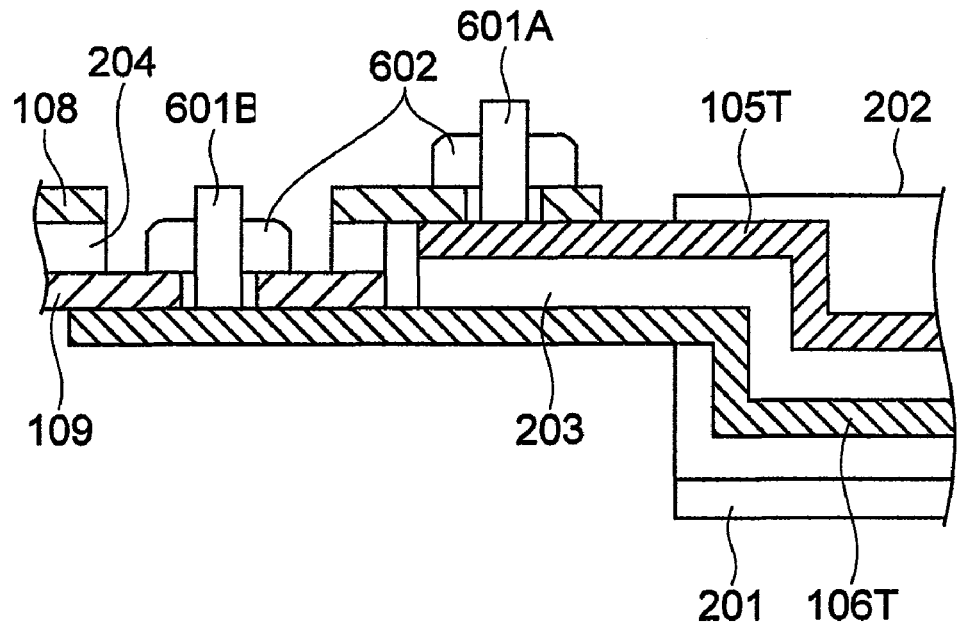
FIG. 8 is a cross-sectional view of FIG. 7B taken along line VIII-VIII.

FIGS. 7A and 7B show arrangements of a power converter in accordance with another embodiment of the present invention. FIG. 7A is a perspective view of the power module 102 built in the power converter, and FIG. 7B is a perspective view of the power module 102, showing the power module 102 and interconnections between the DC bus bars 108, 109 and the AC conductor 126u, 126v, 126w when the power module 102 is built in the power converter. FIG. 8 shows a cross-sectional view of the power converter taken along a line VIII-VIII in FIG. 7B.

FIG. 7A corresponds to FIG. 1, and is different from FIG. 1 in that a male screw 601A is embedded in the plus-side main electrode 105T to be projected upwards in the drawing and a male screw 601B is embedded in the minus-side main electrode 106T to be projected upwards in the drawing.

As in the case of FIG. 1, the male screw 210 is embedded in each of the AC-side main electrodes 107u, 107v and 107w.

The DC bus bars 108 and 109 connected to the plus-side main electrode 105T and the minus-side main electrode 106T respectively have structures substantially similar to those in FIG. 1. However, the DC bus bar 108 has a hole (not shown) through which the male screw 601A embedded in the plus-side main electrode 105T is passed; and the DC bus bar 109 has a hole 611 through which the male screw 601B embedded in the minus-side main electrode 106T is passed. As the hole 611, there is a small hole having a diameter as small as the male screw 601B can be inserted and is extended through the DC bus bar 109, the insulating plate 204 and the DC bus bar 108, and there is a concentric hole of the small hole which has a large diameter much larger than the diameter of the nut 602 (to be explained later) which is extended through the insulating plate 204 and the DC bus bar 108.

Since the nut 602 tightly and threadedly receives the male screw 601A projected from the DC bus bar 108 through the not shown hole, the DC bus bar 108 can be electrically connected to the plus-side main electrode 105T and the connected state can be held.

Within the hole 611, the male screw 601B projected from the DC bus bar 109 is tightened in the nut 602, so that the DC bus bar 109 can be electrically connected to the minus-side main electrode 106T and the connected state can be held.

In this case, the hole 611 is formed to have a relatively large diameter. This is because the nut 602 can easily threadedly receive the male screw 601B and insulation can be secured between the DC bus bar 108 and the nut 602.

Figure 3E:
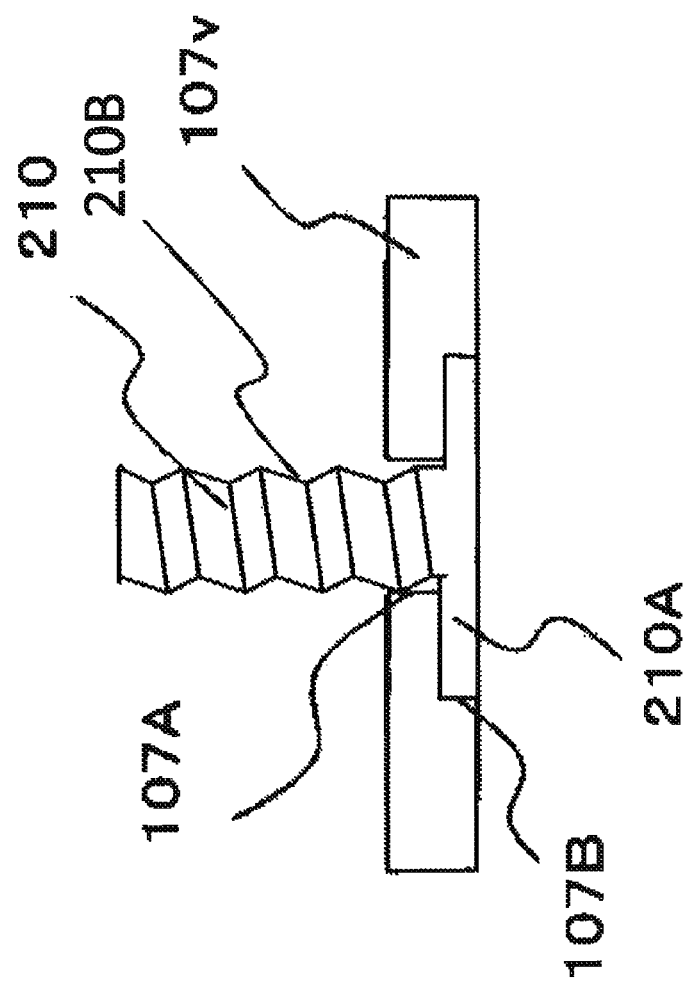

The male screws 601A and 601B projected from one conductor surfaces of the plus-side main electrode 105T and the minus-side main electrode 106T are fixed to the plus-side main electrode 105T and the minus-side main electrode 106T respectively. The male screws 601A and 601B include heads having flange parts smaller in thickness than the plus-side main electrode 105T and the minus-side main electrode 106T and also include projections which are erected on one surfaces of the heads and which have a diameter smaller than the shortest distance between the center of the head and its outer edge. The head is made in the form of a disk or a short circular cylinder. However, another shape of plate or short circular cylinder may be employed therefor. As shown in FIG. 3E, the projection is made in the form of a circular cylinder with a thread 210B in its outer peripheral surface.

With respect to the AC-side main electrode 107u, 107v or 107w, as in the case of FIG. 1, the male screw 210 of the AC-side main electrode 107u, 107v or 107w is inserted in the hole (denoted by reference numeral 126A in FIG. 4) formed in the AC conductor 126u, 126v or 126w, and the nut 602 threadedly and tightly receives the male screw 210, so that AC conductor 126u, 126v or 126w is electrically connected to the AC-side main electrode 107u, 107v or 107w.

With the power module 102 thus arranged, the positioning of the DC bus bars 108 and 109 to the plus-side main electrode 105T and the minus-side main electrode 106T can be facilitated and electrically reliable interconnection therebetween can be attained.

Figure 9:
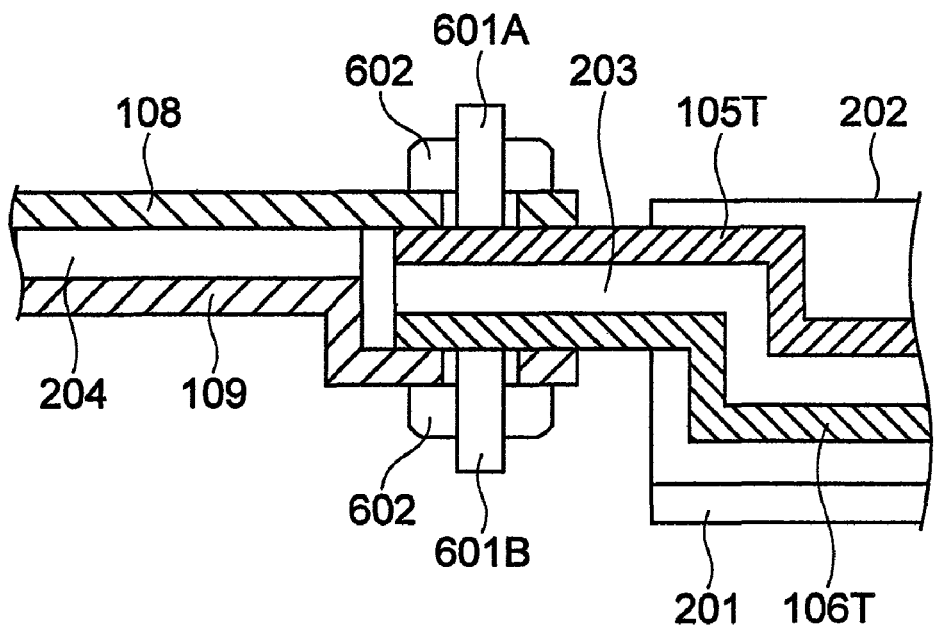
FIG. 9 is yet another example of the power module of FIGS. 7A and 7B, corresponding to FIG. 8.

In the power module 102 shown in FIG. 1, the plus-side main electrode 105T is formed to be shorter in its current flowing direction than the minus-side main electrode 106T. However, the present invention is not limited to this example. For example, as shown in FIG. 9, the plus-side main electrode 105T and the minus-side main electrode 106T may have an identical length (in the current direction). In this case, as shown in FIG. 9, the male screw 601A embedded in the plus-side main electrode 105T is arranged to be coaxially with the male screw 601B embedded in the minus-side main electrode 106T and the tip ends of the male screws are extended in mutually opposing directions and projected from the respective electrode surfaces. In FIG. 9, the male screws 601A and 601B are coaxially arranged. However, these male screws may be located along different axes respectively.

The DC bus bars 108 and 109 are formed with holes at locations corresponding to the male screws 601A and 601B, the male screws 601A and 601B are inserted into the respective holes to be positioned, and the nuts 602 threadedly and tightly receive the respective male screws 601A and 601B, whereby electric interconnections between the DC bus bar 108 and the plus-side main electrode 105T and between the DC bus bar 109 and the minus-side main electrode 106T can be achieved.

Embodiment 3

Figure 10A:
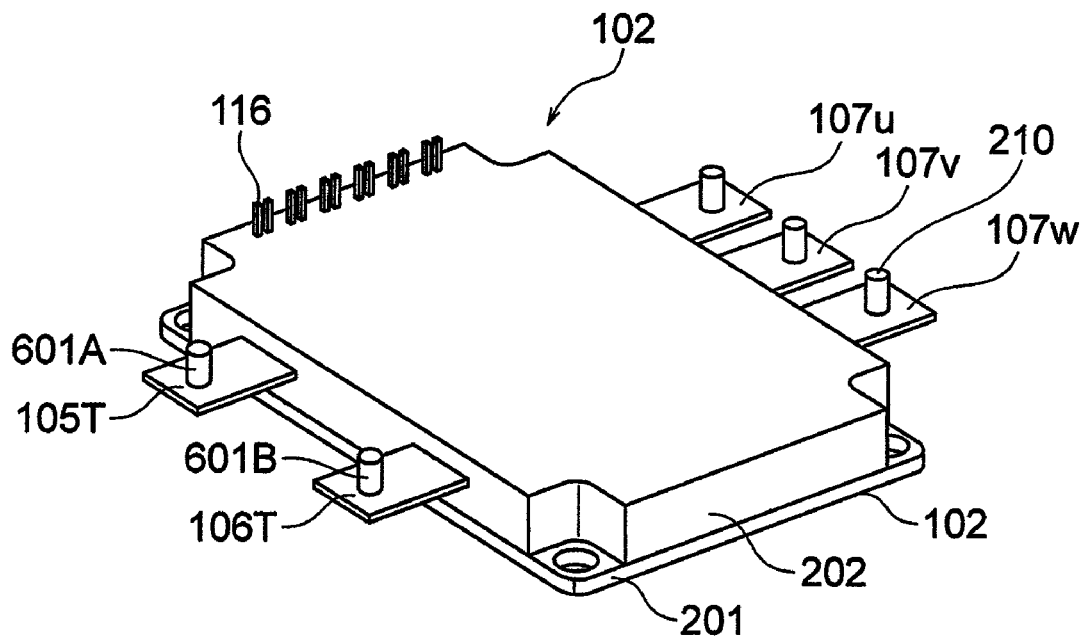
FIGS. 10A and 10B show other example of the power module built in the power converter of the present invention.
Figure 10B:
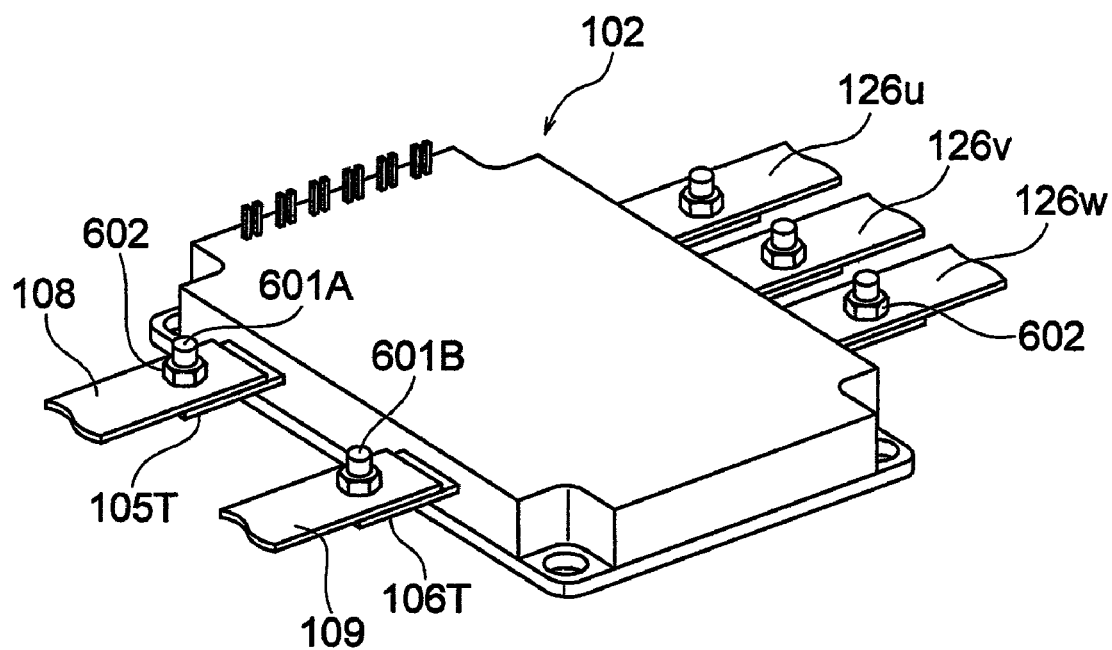

FIGS. 10A and 10B show arrangements of a power converter in accordance with another embodiment.

FIG. 10A is a perspective view of the power module 102 when built in the power converter, and FIG. 10B is a perspective view of the power module 102 when built in the power converter, showing a connection arrangement among the power module 102, the DC bus bars 108, and the AC conductors 126u, 126v, 126w.

FIGS. 10A and 10B correspond to FIGS. 7A and 7B, and are different from FIGS. 7A and 7B by the plus-side main electrode 105T and the minus-side main electrode 106T.

That is, as shown in FIG. 10A, the plus-side main electrode 105T is arranged not to be overlapped with the minus-side main electrode 106T but to be parallel to each other in a plane parallel to the base 201.

The above electrode arrangement holds true even for the AC-side main electrodes 107u, 107v, 107w.

The male screw 601A is embedded in the plus-side main electrode 105T to be projected upwards in the drawing from part of its surface, while male screw 601B is embedded in the minus-side main electrode 106T to be projected upwards in the drawing from part of its surface.

As shown in FIG. 10B, the DC bus bar 108 to be connected to the plus-side main electrode 105T is formed to be physically separated from the DC bus bar 109 at least in the vicinity of the connection, the DC bus bars is formed with a hole in its tip end, the male screw 601A of the plus-side main electrode 105T is inserted into the tip end hole, and the nut 602 threadedly and tightly receives the male screw 601A, with the result that the DC bus bar 108 is electrically connected to the plus-side main electrode 105T. Similarly, the DC bus bar 109 to be connected to the minus-side main electrode 106T is formed to be physically separated from the DC bus bar 108 at least in the vicinity of the connection, the DC bus bar 109 is formed with a hole in its tie end, the male screw 601B of the minus-side main electrode 106T is inserted into the tip end hole, and the nut 602 threadedly and tightly receives the male screw 601B, with the result that the DC bus bar 109 is electrically connected to the minus-side main electrode 106T.

Embodiment 4

Figure 11:
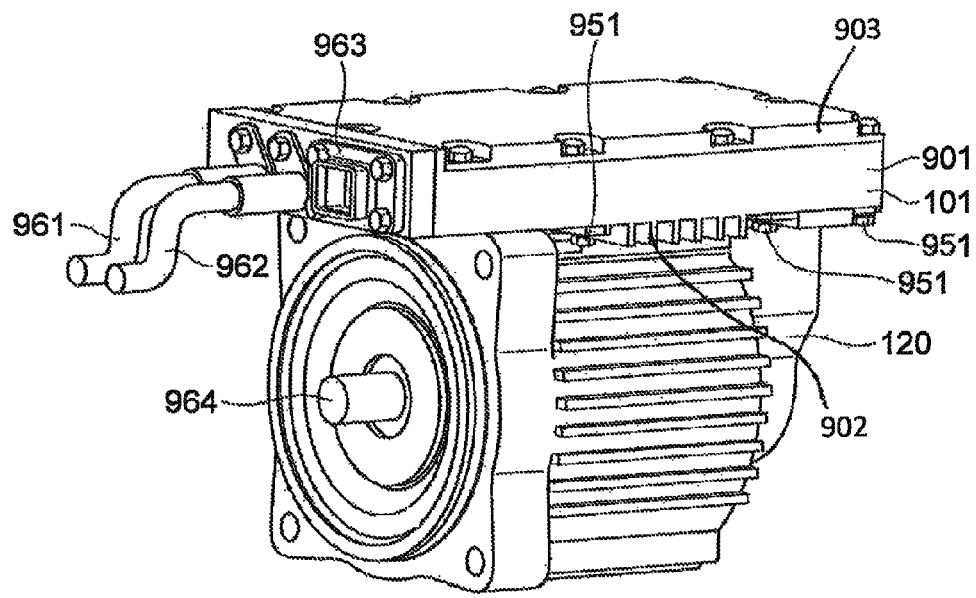
FIG. 11 is a perspective view of an embodiment of the present invention when the power converter is mounted to a rotary electric machine.

FIG. 11 shows a perspective view of an embodiment when the power converter 101 is mounted to the rotary electric machine.

In FIG. 11, the rotary electric machine 120 has an output shaft 964 positioned in a horizontal direction, and the power converter 101 is located, for example, on the top of the rotary electric machine 120.

The power converter 101 is provided to be integral with the rotary electric machine 120 by means of screws 951 or the like tightened between the casing 901 and the rotary electric machine 120. A lid 903 is arranged at the top side of the casing 901 opposite to the bottom surface of the casing 901.

A plus-side DC harness 961 and a minus-side DC harness 962 are formed to be provided at a side surface of the casing 901 and projected therefrom and to be connected to a not-shown DC power source (denoted by reference numeral 121 in FIG. 2).

Although not shown, the AC conductors (denoted by reference numeral 126 in FIG. 2) built in the casing 901 are connected within a side of interior of the rotary electric machine 120 opposed to the output shaft 964.

A connector 963 is mounted at one side surface of the casing 901, and an upper control device (not shown) to be located outside of the power converter 101 is connected to the control circuit board (denoted by reference numeral 115 in FIG. 2) within the casing 901 via the connector 963.

The control circuit board is arranged so that a power is supplied via the connector 963 and a torque command, a rotational speed command, a fail signal, and so on are transmitted from the upper control device.

The aforementioned explanation has been made in the connection with the case where the AC conductors of the power converter are connected within the rotary electric machine. However, such an arrangement may be employed that the AC conductors may be lead out outside of the power converter and be connected with AC conductors within the rotary electric machine through harnesses or the like.

The above explanation has also been made in connection with the case where the power converter 101 is located on the top of the rotary electric machine 120. However, the present invention is not limited to this example, but the power converter 101 may also be located on the side surface of the rotary electric machine 120 or on the bottom thereof.

Embodiment 5

By using FIG. 12, explanation will next be made as to a system for driving a vehicle having such an integrated mechanical/electrical integration type of rotary electric machine mounted on the vehicle as shown in FIG. 11.

In the present embodiment, explanation will be made in connection with a 4-wheel drive vehicle having a main driving shaft driven by an engine as an internal combustion engine and having a follower shaft driven by the mechanical/electrical integration type rotary electric machine of FIG. 11.

The mechanical/electrical integration type rotary electric machine of FIG. 11 may be applied to such a vehicle-mounted electric/mechanical machine that is mechanically coupled to an engine for driving a main drive shaft, generates an assisting driving force of the engine in engine start and acceleration modes when receiving a power from a battery, and also generates a power for charging the battery and a power for driving a vehicle-mounted auxiliary device (electrical load) when receiving the driving force from the engine or the driving force from the drive shaft.

The 4-wheel drive vehicle of the present embodiment has no motor driving battery, and the mechanical/electrical integration type rotary electric machine of FIG. 11 is used in a follower system of rear wheels.

Figure 12:
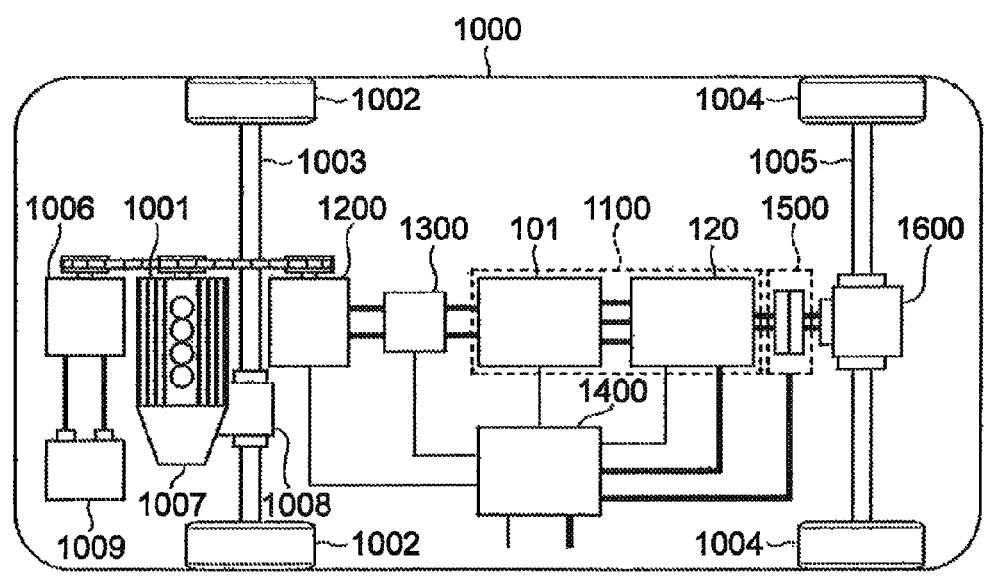
FIG. 12 shows a plain view of an embodiment of a vehicle system having the rotary electric machine of a mechanical/electrical integration type of FIG. 11 mounted therein.

In FIG. 12, a control cable for transmitting a control signal is denoted by a thin solid line, and an electric cable for supplying an electric energy is denoted by a thick solid line larger in line width than the control cable solid line.

The 4-wheel drive vehicle (which will be referred to as the "4-wheel drive vehicle 1000", hereinafter) having no motor driving battery is a composite drive type vehicle which includes a drive system based on an engine 1001 and another drive system based on a motor 120 in such a manner that the engine 1001 as an internal combustion engine drives front wheels 1002 (main wheels) and the rotary motor 120 as a rotary electric machine drives rear wheels 1004 (follower wheels). The engine 1001 is a power source which forms a main drive system for the front wheels 1002 and generates a rotary power from a thermal energy in the full running range of the vehicle. The rotary electric machine 120 is a power source which forms a follower system for the rear wheels 1004 and which generates a rotary drive force from an electric energy when a slip takes place in the front wheels 1002 driven by the engine 1001 and the power of the engine 1001 cannot be transmitted to the road surface during a time from the start of the vehicle until the vehicle reaches a run speed range based on only the engine 1001 and on such a run road as a frozen road having a small friction coefficient μ.

Although explanation is made in the present embodiment in connection with the case where the engine 1001 drives the front wheels 1002 and the motor 120 drives the rear wheels 1004 respectively, such an arrangement may be employed that the engine 1001 drives the rear wheels 1004 and the motor 120 drives the front wheels 1002.

The rotary power of the engine 1001 is decelerated by an automatic transmission 1007 and then transmitted to a drive shaft 1003 of the front wheels 1002 via a power transmission mechanism 1008. As a result, the front wheels 1002 are driven by the engine 1001 in the entire vehicle run range.

The engine 1001 is mechanically coupled with a generator 1006 for vehicle-mounted auxiliary device and with a drive exclusive generator 1200 by belts extended therebetween. The both generators receive rotary powers from the engine 1001 and generate powers having different applications.

The vehicle-mounted auxiliary device generator 1006 forms a 14-volt power source for a vehicle mounted device, and generates a DC power to charge a vehicle-mounted battery 1009 having a nominal output voltage of 12 volts and also a DC power to drive the vehicle mounted auxiliary device.

The drive exclusive generator 1200 forms a motor power source for exclusively generating a driving power for the motor 120 and also forms a vehicle mounted 42-volt power source capable of outputting a power higher than the vehicle-mounted auxiliary device generator 1006. The output voltage of the drive exclusive generator 1200 can be varied from 0 volt to 50 or 60 volt according to a request drive force to the motor 120.

In the present embodiment, explanation will be made in connection with an example when the 4-wheel drive vehicle includes the drive exclusive generator 1200 as the power source of the motor 120. In this case, a space for mounting the follower system of the follower wheels (rear wheels 1004 in the present embodiment) can be made smaller by an amount corresponding to the unnecessary mounting of the motor-drive exclusive large-capacity battery, and the follower system can be provided more inexpensively than in a mechanical 4-wheel drive vehicle having front and rear wheels driven by the power of an engine.

A motor driving battery may be mounted to be charged with the power of the drive exclusive generator 1200.

In the present embodiment, since the motor 120 is driven with a low voltage and a large current of the drive exclusive generator 1200 as a power source, there can be provided such a follower system that outputs a high torque required in the vehicle running performances, and has performances comparable with the mechanical 4-wheel drive vehicle having front/rear wheels driven by the power of the engine.

The vehicle-mounted auxiliary device generator 1006 and the drive exclusive generator 1200 are both located within an engine room together with the engine 1001. Since the drive exclusive generator 1200 is a closed rotary electric machine of a water cooling type, the mounting position of the drive exclusive generator 1200 to the engine 1001 can be mounted to be lower than the mounting position of the vehicle-mounted auxiliary device generator 1006 as an open rotary electric machine of an air cooling type to the engine 1001.

In the present embodiment, since the vehicle has no motor driving battery as mentioned above, a DC power output from the drive exclusive generator 1200 is directly input to the DC side of the inverter 101 via a relay 1300. The inverter 101 converts the input DC power into a 3-phase AC power necessary for driving the motor 120, and supplies the converted 3-phase AC power to the motor 120. The motor 120 is operated with the received 3-phase AC power to generate a rotary power necessary for driving the rear wheels 1004.

The rotational power of the motor 120 is transmitted to a drive shaft 1005 of the rear wheels 1004 via a clutch 1500 connected to the output side of the motor 120 and via a differential gear 1600 connected to the output side of the clutch 1500. With such an arrangement, during a time from the vehicle start until the speed reaches the run speed range based only on the engine 1001 and in a speed range not higher than the highest run speed wherein the rear wheels 1004 can be driven by the rotary power of the motor 120, when a slip takes place in the front wheels 1002 driven by the engine 1001 on a run road such as a frozen road having a small frictional coefficient g and the power of the vehicle-mounted auxiliary device generator 1006 cannot be transmitted to the road surface, the rear wheels 1004 are driven. In the follower system of the present embodiment, thus, the vehicle can be accelerated and run with a high torque while being stabilized, and when a slip takes place in the front wheels 1002, the front wheels 1002 are quickly gripped and the vehicle can be stably and reliably run on a run road having a small frictional coefficient μ.

The differential gear 1600 is a power transmission mechanism which distributes the rotational power of the motor 120 to the right and left parts of the drive shaft 1005 and which is integrally formed with a final reduction gear.

A vehicle drive machine (rotary electric machine) 1100 having the motor 120 and the inverter 101 integrally combined is installed in a narrow space under the floor extended from the rear seat of the vehicle to a trunk room and in the vicinity of the differential gear 1600. In the present embodiment, the vehicle drive machine (rotary electric machine) 1100 can be made compact because of its mechanical/electrical integration type, and can be increased in mountability to the vehicle.

In the present embodiment, since the vehicle drive machine (rotary electric machine) 1100 employs such a mechanical/electrical integration type rotary electric machine as shown in FIG. 11, the vehicle drive machine (rotary electric machine) 1100 can be made compact and can be increased in mountability.

The vehicle drive machine (rotary electric machine) 1100, the clutch 1500, and the differential gear 1600 may be formed to have an integral unit structure.

The clutch 1500 is an electromagnetic power interruption mechanism which electromagnetically controls two clutch plates to control power transmission. That is, the clutch is controlled so that, during a time from the vehicle start until the vehicle reaches the run speed range based only on the engine 1001 an a speed range not higher than the highest speed wherein the rear wheels 1004 can be driven by the rotary power of the motor 120; when a slip takes place in the front wheels 1002 driven by the engine 1001 on a run road such as a frozen road having a small frictional coefficient μ, and when the power of the engine 1001 cannot be transmitted to the road surface, the two clutch plates are tightly coupled each other, so that the rotational power of the motor 120 is controllably transmitted to the differential gear 1600, and when the vehicle speed is in the run speed range based only the engine 1001, the two clutch plates are released from each other and the transmission of the rotational power from the motor 120 to the differential gear 1600 is controllably interrupted.

The devices included in the follower system of the rear wheels 1004 are operated under control of a signal or a power supplied from an electronic circuit device 1400. The electronic circuit device 1400 includes a plurality of control boards each having a plurality of electronic components mounted thereon, including a microcomputer for executing operations necessary for control of the constituent element devices under control of a program, a memory for previously storing therein the program necessary for the operation of the microcomputer, maps, parameters therefor, and so on, and an integrated circuit (IC) having circuit elements such as resistors integrated therein.

The electronic circuit device 1400 performs controlling operations, that is, field control of controlling the electricity generation of the drive exclusive generator 1200 by controlling a field current supplied to the drive exclusive generator 1200, relay control of controlling an electric connection between the drive exclusive generator 1200 and the inverter 101 by controlling the driving operation of contacts of the relay 1300, drive control of controlling the driving operation of the motor 120 by controlling the power converting operation of the inverter 101, and clutch control of controlling the coupling and uncoupling operations of the clutch 1500 by controlling the field current supplied to the clutch 1500.

The electronic circuit device 1400 is electrically connected with the respective devices included in the follower system of the rear wheels 1004 by means of signal cables or electrical cables. The electronic circuit device 1400 is electrically connected with the vehicle-mounted battery 1009 by means of an electrical cable. The electronic circuit device 1400 is also electrically connected by means of local area network (LAN) cables with an engine controller for controlling the operation of the speed regulator mechanism of the automatic transmission 1007 including the component elements (air throttle valve, supply/exhaust value, fuel injection valve) of the engine 1001 and controlling the operation of the vehicle-mounted auxiliary device generator 1006, and with another vehicle controller (not illustrated) such as antilock brake system controller for controlling the operation of a caliper cylinder mechanism forming an antilock brake system. With such an arrangement, information possessed by the respective vehicle controllers can be shared between the vehicle controllers, and the electronic circuit device 1400 can acquire a shift position signal, an acceleration pedal opening signal, and an engine rotational speed signal from the engine controller, and also acquire a wheel speed signal from the antilock brake system controller, as input information as necessary, and can use such input information for the aforementioned control.

The above explanation has been made in connection with the case where the operation of the speed regulator mechanism included in the automatic transmission 1007 in the present embodiment. However, when the speed regulator controller is mounted on the vehicle, the operation of the speed regulator mechanism forming the automatic transmission 1007 is controlled by the speed regulator controller. In this case, the shift position signal input to the electronic circuit device 1400 is acquired from the speed regulator controller via the LAN cable.

The aforementioned embodiments may be used independently or in combination thereof to obtain the effects of the embodiments independently or in combination thereof.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A power converter comprising:
   a power module having a first plate-shaped conductor connected to a second plate-shaped conductor; and
   a casing having a lid and storing the power module, wherein:
   the power module is arranged on a bottom surface of the casing,
   the lid is arranged at a top side of the casing opposite to the bottom surface of the casing,
   a projection having a projecting portion and a flange portion is pre-installed in the first plate-shaped conductor so that the projecting portion projects upward toward the lid of the casing,
   the second plate-shaped conductor has a first hole corresponding to the projecting portion, and
   a nut is arranged above the second plate-shaped conductor and surrounding a section of the projecting portion such that the first plate-shaped conductor and second plate-shaped conductor are electrically connected by tightening the nut.

2. The power converter according to claim 1, wherein the first plate-shaped conductor of the power module is projected from a side wall of the power module.

3. The power converter according to claim 1, wherein the power converter is fixed to a rotary electric machine.

4. The power converter according to claim 1, further comprising:
   a smoothing capacitor for smoothing a direct current;
   wherein the second plate-shaped conductor is connected to an electrode of the smoothing capacitor.

5. The power converter according to claim 4, further comprising:
   an insulating plate;
   wherein the first plate-shaped conductor comprises a plus-side plate-shaped electrode and a minus-side plate-shaped electrode,
   the insulating plate is arranged between the plus-side plate-shaped electrode and the minus-side plate-shaped electrode, and
   the flange portion and the plus-side plate-shaped electrode or the minus-side plate-shaped electrode together form a flat surface that is in contact with the insulating plate.

6. The power converter according to claim 1,
   wherein the second plate-shaped conductor is connected to a terminal of a rotary electric machine.

7. The power converter according to claim 4, further comprising:
   a first insulating plate and a second insulating plate;
   wherein the first plate-shaped conductor comprises a plus-side plate-shaped electrode and a minus-side plate-shaped electrode,
   the first insulating plate is arranged between the plus-side plate-shaped electrode and the minus-side plate-shaped electrode,
   the second plate-shaped conductor comprises a plus-side bus bar and a minus-side bus bar, and
   the second insulating plate is arranged between the plus-side bus bar and the minus-side bus bar.

8. The power converter according to claim 7,
   wherein the plus-side plate-shaped electrode is arranged beneath the minus-side plate-shaped electrode, and
   a length of the plus-side plate-shaped electrode along a direction in which a current flows is greater than a length of the minus-side plate-shaped electrode along the direction in which the current flows.

9. The power converter according to claim 7, wherein the minus-side plate-shaped electrode is arranged beneath the plus-side plate-shaped electrode, and
a length of the minus-side plate-shaped electrode along a direction in which a current flows is greater than a length of the plus-side plate-shaped electrode along the direction in which the current flows.

10. The power converter according to claim 7, wherein the power module has a side wall that surrounds a semiconductor,
the side wall is made of a resin,
the plus-side plate-shaped electrode is arranged above the minus-side plate-shaped electrode, and
the first insulating plate is formed integrally with the side wall and projects from the side wall to an edge of the plus-side plate-shaped electrode.

11. The power converter according to claim 7, wherein the power module has a side wall that surrounds a semiconductor,
the side wall is made of a resin,
the minus-side plate-shaped electrode is arranged above the plus-side plate-shaped electrode, and
the first insulating plate is formed integrally with the side wall and projects from the side wall to an edge of the minus-side plate-shaped electrode.

12. The power converter according to claim 1, wherein the first plate-shaped conductor has a recess part or a second hole, and
the flange portion of the projection is pre-installed in the recess part or the second hole.

13. The power converter according to claim 12, further comprising:
a brazing material in contact with the flange portion and the recess part or the hole.

14. The power converter according to claim 1, wherein a thread is formed on a circumferential surface of the projecting portion.

15. A power converter comprising:
a power module having a plus-side plate-shaped electrode, a minus-side plate-shaped electrode, and a plurality of AC-side plate-shaped electrodes;
a plurality of plate-shaped conductors respectively connected to the electrodes of the power module;
a smoothing capacitor for smoothing a direct current; and
a casing having a lid and storing the power module and the smoothing capacitor,
wherein, the power module is arranged on a bottom surface of the casing,
the lid is arranged at a top side of casing opposite to the bottom surface of the casing,
a plurality of projections, each of which has a projecting portion and a flange portion, are respectively pre-installed in the plus-side plate-shaped electrode, the minus-side plate-shaped electrode, and the AC-side plate-shaped electrode so that the projecting portions project upward toward the lid of the casing,
each of the plate-shaped conductors has a hole corresponding to a respective one of the projecting portions,
nuts are arranged above each of the plate-shaped conductors and surrounding sections of the respective projecting portions such that the plus-side plate-shaped electrode, the minus-side plate-shaped electrode, and the AC-side plate-shaped electrode are electrically connected to the respective plate-shaped conductors by tightening the nuts,
two of the plate-shaped conductors are connected to electrodes of the smoothing capacitor,
the remaining of plate-shaped conductors connect to terminals of a rotary electric machine.

16. A method for constructing a power converter that comprises:
a power module having a first plate-shaped conductor connected to a second plate-shaped conductor; and
a casing having a lid and storing the power module,
wherein, the power module is arranged on a bottom surface of the casing,
a projection having a projecting portion and a flange portion that is pre-installed in the first plate-shaped conductor so that the projecting portion projects upward toward the lid of the casing,
the second plate-shaped conductor has a hole corresponding to the projection,
a nut is arranged above the second plate-shaped conductor and surrounding a section of the projecting portion,
the method comprising:
providing the first plate-shaped conductor in which the projection is pre-installed,
coupling the first plate-shaped conductor and the second plate-shaped conductor by arranging the hole of the second plate-shaped conductor to surround a section of the projecting portion of the projection of the first plate-shaped conductor,
causing the second plate-shaped conductor to be electrically connected to the first plate-shaped conductor by tightening the nut, and
arranging the lid at a top side of casing opposite to the bottom surface of the casing.

\* \* \* \* \*